US008160825B1

(12) United States Patent  
Roe, Jr. et al.

(10) Patent No.: US 8,160,825 B1  
(45) Date of Patent: Apr. 17, 2012

(54) PROCESS FOR REMOTE GROUNDING, TRANSMISSION SENSING, AND TEMPERATURE MONITORING DEVICE

(76) Inventors: George Samuel Roe, Jr., Jacksonville, FL (US); Henry Winfield Price, Jr., Jacksonville, FL (US); Mylene Farenas Matthews, Jacksonville, FL (US)

( * ) Notice: Subject to any disclaimer, the term of this patent is extended or adjusted under 35 U.S.C. 154(b) by 0 days.

(21) Appl. No.: 13/281,741

(22) Filed: Oct. 26, 2011

(51) Int. Cl.  
G01R 31/00 (2006.01)  
G06F 19/00 (2011.01)

(52) U.S. Cl. ......................................................... 702/58
(58) Field of Classification Search ....................... 702/58  
See application file for complete search history.

(56) References Cited

U.S. PATENT DOCUMENTS

| | | | | |
|---|---|---|---|---|
| 6,917,888 B2 * | 7/2005 | Logvinov et al. | ................ | 702/59 |
| 7,133,729 B1 * | 11/2006 | Wang et al. | ..................... | 700/83 |
| 7,786,894 B2 * | 8/2010 | Polk et al. | ................ | 340/870.07 |
| 2008/0077336 A1 * | 3/2008 | Fernandes | ................ | 340/870.07 |
| 2010/0085036 A1 * | 4/2010 | Banting et al. | ................. | 324/127 |
| 2011/0279278 A1 * | 11/2011 | Al-Absi et al. | ............... | 340/584 |

* cited by examiner

*Primary Examiner* — Cindy H Khuu  
(74) *Attorney, Agent, or Firm* — Matthew P. Davies (57) ABSTRACT

A system to monitor power line temperatures, ground moisture levels, to visually inspect the area around said power line poles and to transmit said data over short, mid, or long range to a monitoring base station for analysis. Said means for monitoring power line conditions are a non-contact temperature sensor, a photo-interrupter, and a digital camera. The camera will be capable of responding to motion automatically or be used in a remote fashion either by day or night. By utilizing the current monitoring setup the potential errors, dangers, or threats of power line failure may be avoided. Further, through the following set up analysis of a failure event at a specific (or group of) power line may be done on site, or remotely and will greatly increase the efficient analysis and repair of failure events.

17 Claims, 9 Drawing Sheets

PROCESS FOR REMOTE GROUNDING, TRANSMISSION SENSING, AND TEMPERATURE MONITORING DEVICE

CROSS-REFERENCES

None

GOVERNMENT RIGHTS

None

OTHER PUBLICATIONS

IEEE Std 142-1991 Chp. 2, pg 98-100; pg 171-173.

BACKGROUND OF INVENTION

Field of Invention

The technology described in the disclosed patent document relates generally to the field of optical, temperature, and remote ground sensing of high voltage power lines and the surrounding area thereof and the transfer of generated data to a utility station.

DISCUSSION

Purpose of the Invention

The purpose of the disclosed invention is to constantly measure and monitor the conditions around modern high voltage power lines. This is to be done via measuring the ground resistance of the earth at a location near the base of existing power line poles, by measuring the non-contact temperature of the high voltage lines themselves, and by employing the use of a camera to visually monitor the area around the base of the power pole both day and night. The disclosed device is designed to secure and monitor a power line from shutdown or failure of power transmission due to the overheating of conductor wires, and/or ground resistance values outside of a set threshold. This is done first by monitoring and measuring the change in ground resistance due to moisture from standard environmental conditions and second by visually monitoring the area around the tower base for movement. In the event of a failure a signal is generated and transmitted by short, mid, and long range transceivers to a monitoring base station or utility.

The invention will consist of three sensors, a line temperature sensor, a ground moisture sensor, and a camera capable of operating both day and night. The invention will further comprise a $1^{st}$ transceiver node acting as a sensor signal conditioning unit (SCU) connected to each respective temperature sensor, a discrete interface circuit (DIC) so further condition a generated signal connected to each respective signal conditioning unit, a user interface device (UID) connected to each respective transceiver (not shown), an external memory unit (EMU), and a set of short, mid, and long range transmitting units (SRTU, MRTU, LRTU).

Measuring the ground resistance (and any change thereof) due to moisture around the power line pole base is accomplished with a photo-interrupter ground sensor or ground moisture sensor (GMS). Said sensor is buried under the ground to a depth of at least eight feet as required by the IEEE National Code. Further, the GMS is located at least twenty-five feet away from the perimeters of the encircled grounding electrodes of power lines. To that end the photo-interrupter circuit consists of an infrared (IR) light emitting diode (LED) and an IR phototransistor coupled to a comparator and is used to measure the resistance of the ground based on its moisture content whereby said resistance (compared to standard environmental conditions) should never exceed 25Ω.

This configuration of light sensing interrupt circuitry is superior to the prior art in that it has a higher sensitivity for detecting light scattered off of suspended atmospheric water droplets. These suspended atmospheric water droplets arise in a ground cavity from the presence of moisture. It is critical that the phototransistor and the IR light source be aligned properly so as to set a background voltage associated with standard conditions and to avoid faulty detection of moisture.

The GMS generates a constant analog signal that is monitored by the transceiver for a change in resistance of the ground around the tower. The transceiver converts the analog signal into a digital signal and compares said value to threshold values stored in an EMU. If the resistance exceeds 25 ohms, the transceiver generated signal will be further conditioned by the connected DIC and coupling circuit before being transmitted by a SRTU to a MRTU or a LRTU. The DIC is operably connected to a user interface device (UID) whereby a user at each node may access and analyze the data on site either before, during, or after transmission. The UID may comprise a red LED and green LED indication system, LCD touch screen, and/or a direct interface which may include, without limitation, a USB connect, Fire Wire, or serial input for analysis of the data by a peripheral user device such as a laptop. The incorporated UID may also contain circuitry (no shown) to allow a user access at each node via a wireless connection to a laptop or other such mobile wireless device including but not limited to a cell phone.

In monitoring the line and ground conditions within normal operating parameters the UID will maintain a state in which the green LED on the user interface is illuminated. This is done so that a user may quickly, visually assess, from a distance which lines are in fault, thereby negating the necessity of checking each pole's interface device by connecting a laptop. If operating parameters are exceeded, the GSM's UID will turn the green LED off and illuminate the red LED. From here the user would then either use the LCD screen or connect an external laptop to analyze the data.

With respect to the second sensor, the non-contact line temperature sensor, analogous setups exist. Such that for the line temperature sensor (LTS), the connected transceiver will monitor the change in the line temperature of the conduction wire on the tower. The use of a non-contact temperature sensor including but not limited to a 0° C. to 500° C. IR phototransistor to monitor the line condition is 95% more accurate than other contact temperature measuring systems and is not effected by environmental conditions such as wind or rain. If the temperature of the line or wire increases above a set threshold, the SCU will condition the generated signal and transmit in an analogous manner to a base station.

The line transceiver(s) and attached sensors will be powered by batteries which will be recharged by solar panels. The line computer may also be powered by any number of means including but not limited to direct line power, induction, fuel cell, etc. Further the transmission units of either the GSM or LTS may be comprised of an AM or FM radio transmitter, satellite, optical, or wireless router technologies.

Transmission of line conditions are relayed to a main control unit computer via a series of node channels in a hybrid topology network. Said node channels are a system of relaying computers between the measured line and the main control unit computer at the utility station. Each high-voltage electrical pole has an ID code assigned by the utility (already in use) that must be programmed into each transceiver and correlated to the transceiver generated ID code so that the utility knows which high-voltage electrical poles are at fault. Further, each node incorporates circuitry on each sensor which has a built in data history function accessible via the utility or on site. What follows is a brief example description of a power line event.

An event, defined as an anomalous line temperature, ground moisture reading, or camera input, occurs in which a local computer generates a data signal from the event to be transmitted to the closest central node within a set range of the hybrid topology network. The data packet(s) is transmitted on a primary frequency (in the case of RF) to said node where it is passed along from node to node until it reaches the main control unit computer at the designated utility. Depending on the distance between nodes, the closest receiving/transmitting node capable of passing along the signal may be a short, mid, or long range transmitter. At the utility an acknowledgement signal is generated and sent back to the line computer that generated the anomalous signal. If the line computer does not receive an acknowledgement signal the line computer will then send a second data packet(s) on a secondary frequency and await acknowledgement. This will continue over a range of frequencies until acknowledgement is received by the line computer. Data transmission occurs through radio frequency (both AM and FM), satellite frequencies, microwaves, direct hard line connection, LAN, WLAN, etc.

Visual monitoring of the area around the base of each tower is achieved by the use of a digital camera. The camera is connected to the same circuitry as the LTS and signal generation and monitoring follows the same procedure as the line temperature generated signal. The camera has the added option of being automatically controlled by additional circuitry (not shown) or controlled manually either at the UID or remotely by the utility base station. In the event that a failure requires on site monitoring or care, service personnel may be dispatched by the utility station to assess the situation on the ground.

Typical systems exist for monitoring bulk electrical power of high voltage power lines. These incorporate systems whereby the monitoring devices are attached to said power lines directly and either transmit data directly to a base station or to a local receiver which then communicates the data to the base station. Several drawbacks exist to these approaches. First when the monitoring devices are directly attached to a high voltage power line, maintenance becomes cumbersome at best and dangerous at worst as one would have to contend with the large voltages flowing through said power lines. Secondly said directly attached monitoring devices are powered by induction from the high voltage power lines them selves. In the event of a failure on one of the lines such that power ceases the monitoring capability of the device ceases as well. From the perspective of a base station there would simply be no signal generated. Lastly in a device of this type, having the monitoring device on the power lines themselves means that the device would be located at a great distance from the ground and thereby difficult to see. This would make assessment of the state of either the device or the line conditions impossible to a utility worker located at the base of the power line pole. What is needed is a system that solves these discrepancies to allow for a more efficient and cost effective means of monitoring the state of high voltage power lines.

SUMMARY OF INVENTION

In accordance with the teachings of this invention as embodied and described herein, systems are provided for a means to monitor power line temperatures, ground moisture levels, to visually inspect the area around said power line poles and to transmit said data over short, mid, or long range to a monitoring base station for analysis. Said means for monitoring power line conditions are a non-contact temperature sensor, a photo-interrupter, and a digital camera. The camera will be capable of responding to motion automatically or be used in a remote fashion either by day or night.

By utilizing the current monitoring setup the potential errors, dangers, or threats of power line failure may be avoided. Further, through the following set up analysis of a failure event at a specific (or group of) power line may be done on site, or remotely and will greatly increase the efficient analysis and repair of failure events.

DETAILED DESCRIPTION OF THE INVENTION

Figure 1:
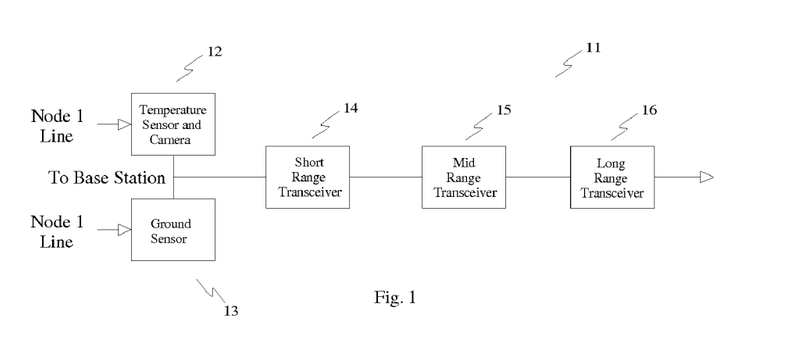
FIG. 1 is an example block diagram of a system for transferring sensor information to a utility source.

Referring now to the drawings, and more particularly FIG. 1, the present invention as shown in one embodiment is an example block diagram 11 for sensing and transferring power line and ground moisture conditions to a utility source via short, mid, and long range transceivers. Said sensors may include a ground moisture sensor 13, a temperature sensor 27, and a camera 28. The ground moisture sensor 13 and the camera 28 are designed to measure and monitor the area around the base of a power line pole and the temperature sensor 27 is designed to measure the temperature of high voltage power lines. Upon detecting conditions in their respective regions the sensors will pass on their data to a series of short range transceivers 14, then a mid range transceiver 15, then a long range transceiver 16, and finally to a monitoring base station such as a utility company.

Figure 2:
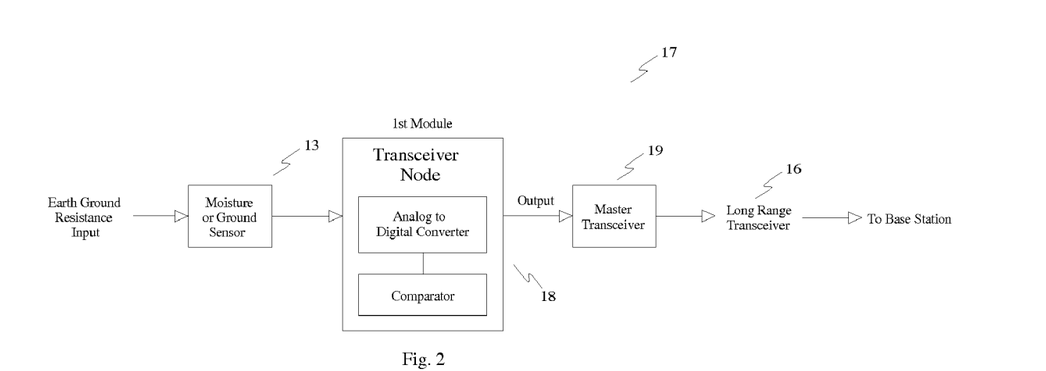
FIG. 2 is an overall block diagram of the subsystem for transferring the ground sensor information to the base station.

FIG. 2 shows a block diagram of the first module transceiver assembly 17, in which the ground sensor 13 senses the Earth ground resistance via moisture change. The ground sensor 13 then generates an analog signal in which the $1^{st}$ transceiver node 18 then converts to a digital signal and via a comparator outputs said signal (not to exceed a set 25 ohm threshold value for upper limit and a user defined lower limit based on the soil conditions at each respective pole) to a master transceiver 19. The master transceiver 19 will then send said output signal via a long range transceiver 16 to a base station for monitoring.

Figure 3:
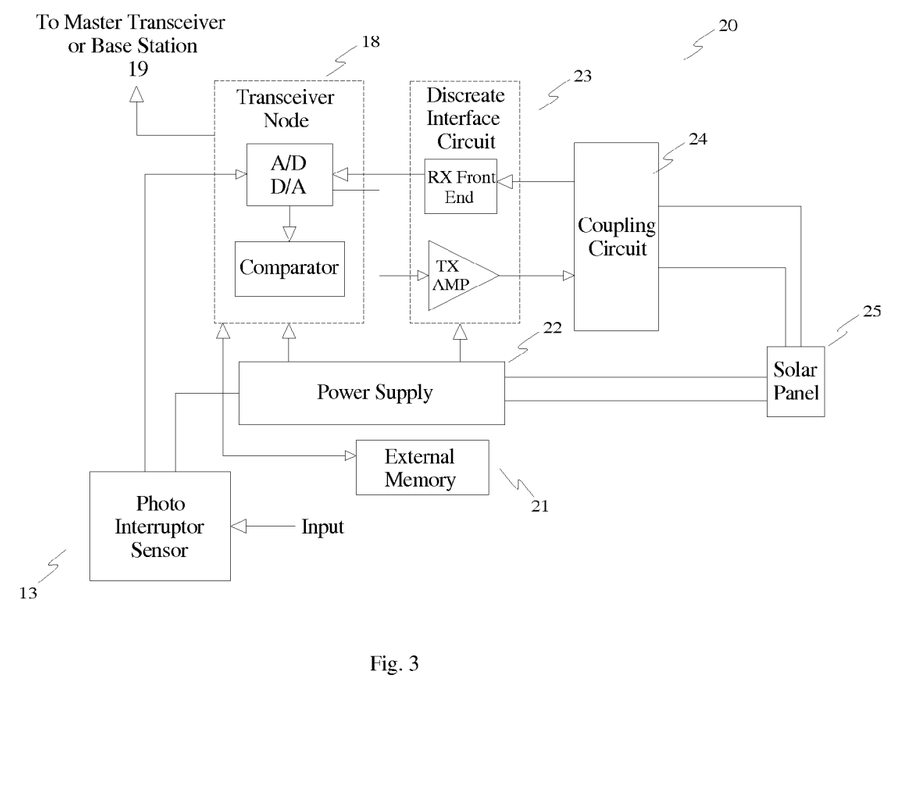
FIG. 3 is an expanded block diagram of the subsystem for transferring the ground sensor information to the master transceiver or base station.
Figure 4:
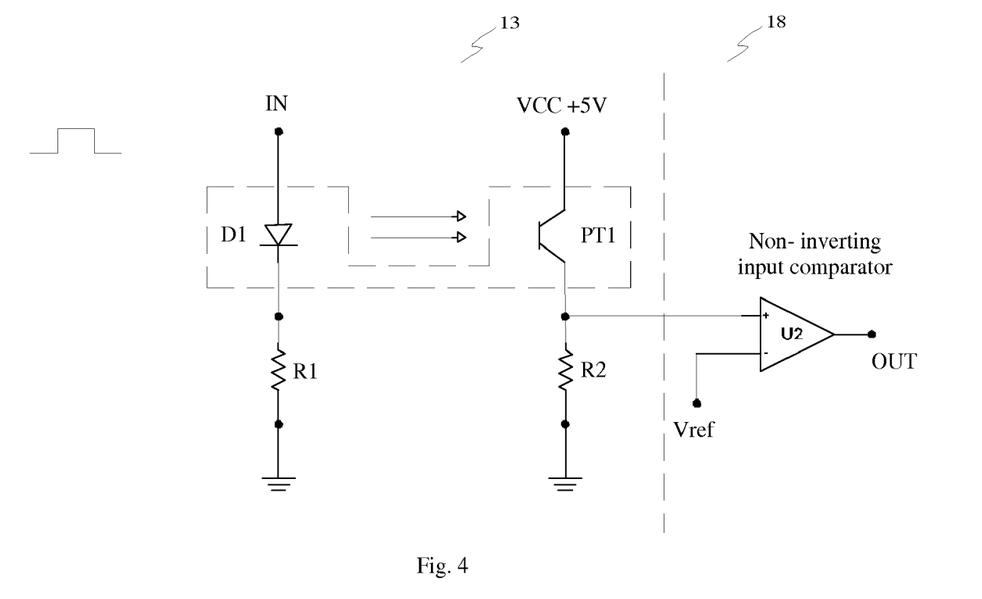
FIG. 4 is an electrical schematic diagram of the photo interrupter circuit.

FIG. 3 shows an expanded view of the circuitry 20 for the ground sensor 13 and the 1st transceiver node 18. In one embodiment the ground sensor 13 is a photo interrupter circuit (as shown in FIG. 4) that is designed to detect the moisture content of the ground surrounding a power line pole. This is achieved by the use of a light emitting source, and a light receiving source where said light emitting and receiving source may be without limitation in the infrared region of the spectrum. Further, said light emitting and receiving source may be without limitation a light emitting diode (LED) and a phototransistor as shown. The light source and sink are positioned such that the light must traverse a known distance before intercepting the light sink. As particles of moisture or $H_2O$ pass through the light path a portion of the light will be absorbed thus decreasing the intensity of the light beam and directly measuring the ground moisture concentration.

Returning to FIG. 3 the circuitry 20 is powered by a solar panel 25 DC power supply 22. The circuitry 20 may also be powered by any number of means including but not limited to direct line power, induction, fuel cell, etc. Upon analog signal generation by the photo interrupter sensor 13, said signal is converted to a digital signal via the analog/digital converter 18 and compared 18 to stored threshold values within the external memory 21.

The discrete interface circuit 23 and coupling circuit 24 provides filtering (RX Front End) for the on-chip A/D and drives (TX Amp) the transmit signal. The coupling circuit 24 further acts as a high-pass filter to provide surge and line transient protection in addition to blocking low frequency signals.

Figure 5:
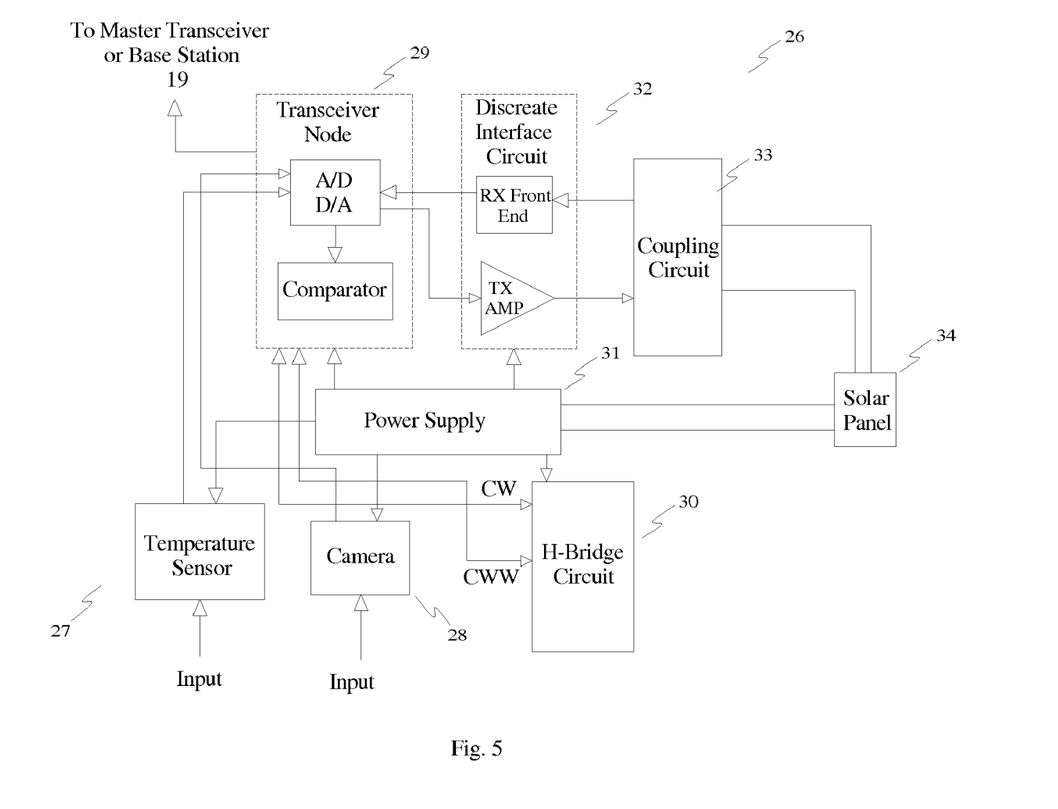
FIG. 5 is an expanded block diagram of the subsystem for transferring the temperature and camera sensor information to the master transceiver or base station.

FIG. 5 shows an expanded view of the circuitry 26 for the temperature 27 and camera 28 sensors as well as the transceiver node 29, discrete interface circuitry 32, and coupling circuit 33. The circuitry performs in an analogous fashion as that in FIG. 3. with the additional camera 28 and H-bridge 30 circuitry. The circuitry 26 is powered by a solar panel 34 DC power supply 31, but may also be powered by any number of means including but not limited to direct line power, induction, fuel cell, etc. The non contract temperature sensor may be any commercially available infrared temperature sensor capable of detection ranges including but not limited to 0° to 500° C. Upon analog signal generation by the temperature sensor 27, said signal is converted to a digital signal via the analog/digital converter 29 and compared to stored threshold values via a comparator 29. The discrete interface circuit 32 and coupling circuit 33 provides filtering (RX Front End) for the on-chip A/D and drives (TX Amp) the transmit signal. The coupling circuit 33 further acts as a high-pass filter to provide surge and line transient protection in addition to blocking low frequency signals.

The camera may be without limitation any commercially available CCD or CMOS type device. Upon digital signal generation by the camera sensor 28 the transceiver node 29, discrete interface circuit 32, and coupling circuit 33 filter and boost the signal for transmitting. The motion of the camera sensor is controlled by an H-bridge circuit 30 that generates a clockwise (CW) or counterclockwise (CWW) motion, which may be operated automatically in response to an event or by manual remote access.

Figure 6:
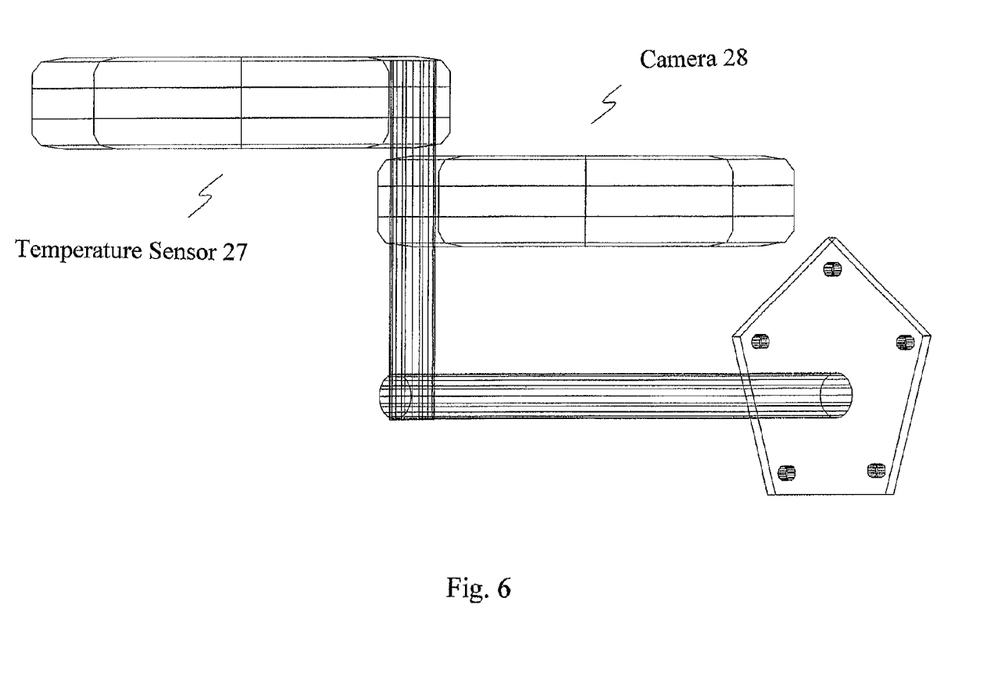
FIG. 6 is a typical example of the mechanical set up of the camera.

FIG. 6 shows a typical mechanical setup 36 of the camera 28 and temperature 27 sensors as they would be mounted on a sensor pole located near the base of a power line pole.

Figure 7:
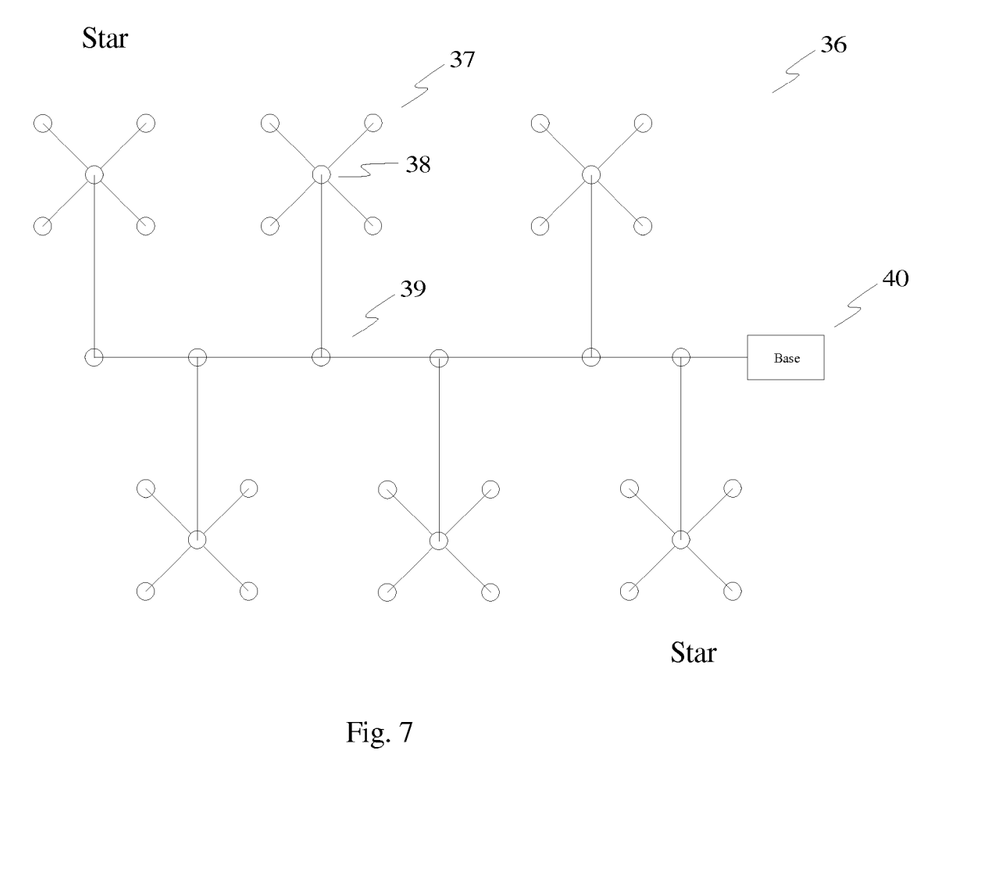
FIG. 7 is an example of the hybrid topological network used to transfer sensor data to a utility.

FIG. 7 shows a typical hybrid topology network setup 36 as used by the short range transceivers 37 to send data to the mid 38 and long range transceivers 39 to ferry data from the powered line pole locations to the various mid and long range transceivers and ultimately to the base station 40 for monitoring.

Figure 8:
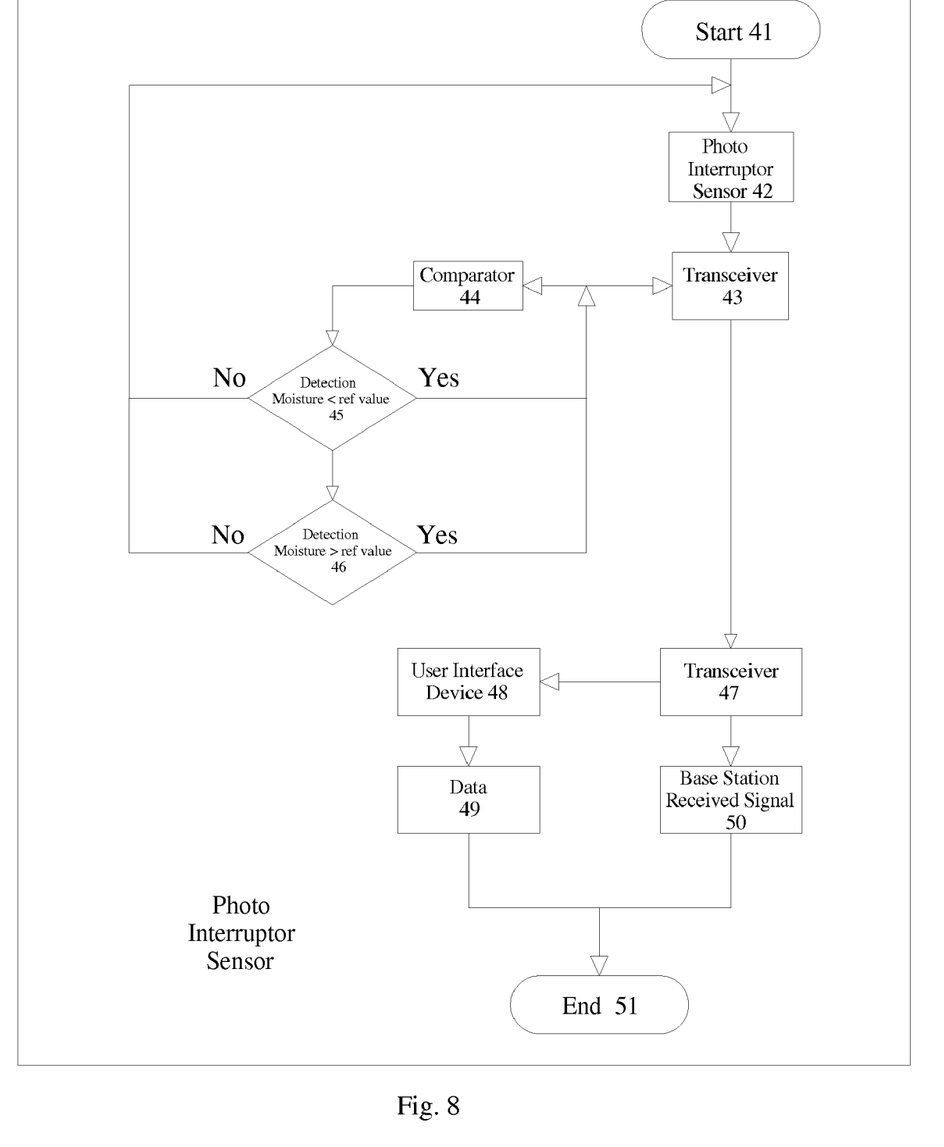
FIG. 8 is a flowchart diagram illustrating one embodiment of the photo interrupter sensor.
Figure 9:
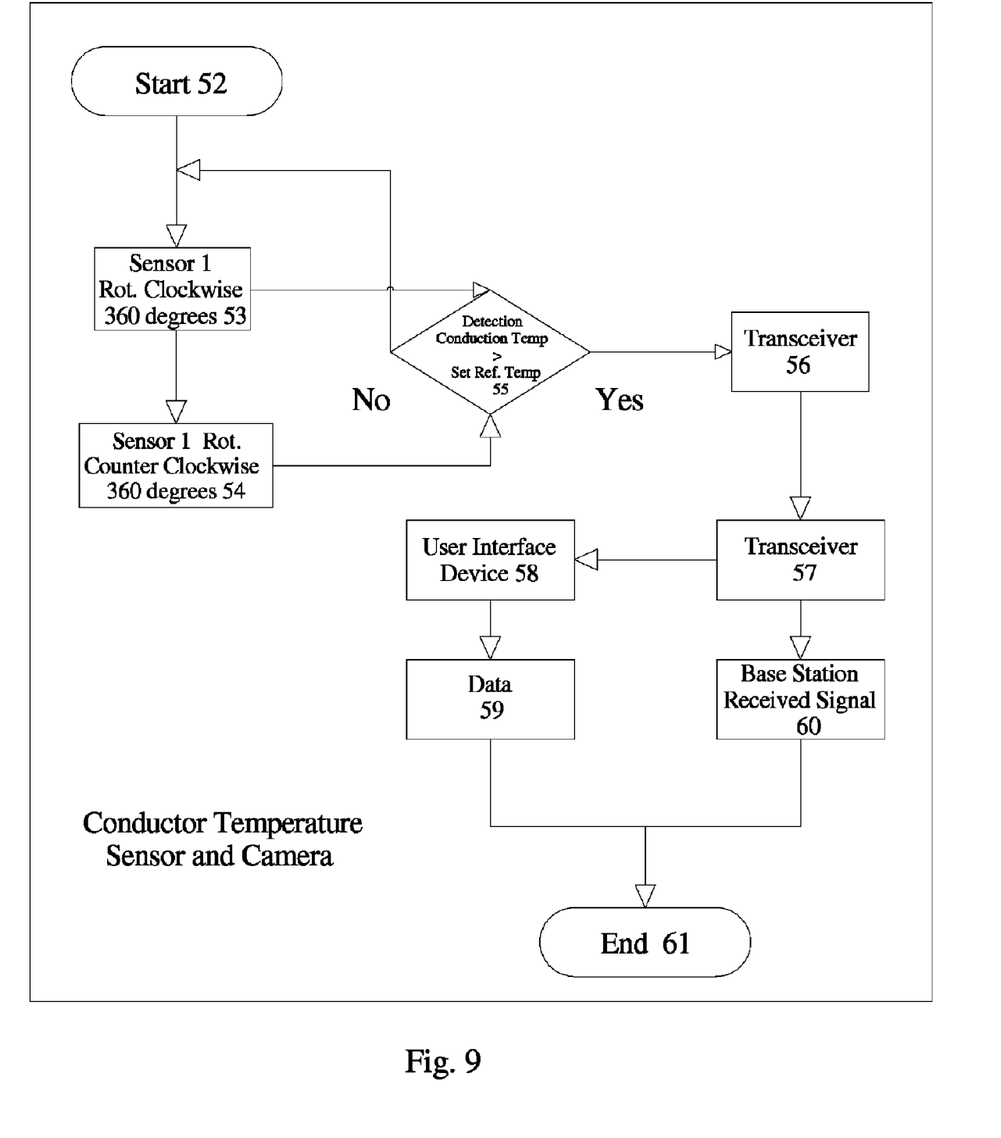
FIG. 9 is a flowchart diagram illustrating one embodiment of the temperature and camera sensor.

FIGS. 8 and 9 show an example flowchart diagram of the operation of the photo interrupter, temperature and camera systems respectively.

The flowchart of FIG. 8 starts 41 with the photo interrupter 42 detecting a ground condition and generating a signal. Said signal is sent to a short range transceiver 43 and then to a comparator 44. The comparator 44 will compare the signal generated to reference values stored in memory. If the signal value is within range then no further action is taken and the procedure recycle back to the start 41 position. If, however, the signal is above or below the threshold value, the signal is transferred back to the short range transceiver 43, sent to the mid or long range transceiver 47 before being acquired by the base station 50. If a user wishes to asses the data 49 and the state of the signal, said user may do so at a PC interface 48 located on either the mid or long range transceiver 47 modules. Once the signal has been acquired by the base station 50 the procedure ends 51 and resets to the start 41 position.

The flowchart of FIG. 9 starts 52 with the simultaneous monitoring of the line temperature sensor 55 and control of the camera rotation 53/54. The camera rotation sensor can rotate the camera either 360 degrees clockwise 53 or 360 degrees counterclockwise 54. This is done to monitor the temperature of the power lines and the area around the power line poles such that if the camera and subsequently the temperature sensor detects a power line conduction temperature that is greater than a set threshold value it will generate a signal and send said signal to a short range transceiver 56. The signal then is sent to a mid or long range transceiver 57 before being acquired by the base station 50. If a use wishes to asses the data 59 and the state of the signal, said user may do so at a PC interface 58 located on either the mid or long range transceiver 57 modules. Once the signal has been acquired by the base station 60 the procedure ends 61 and resets to the start 52 position.

Figure 10:
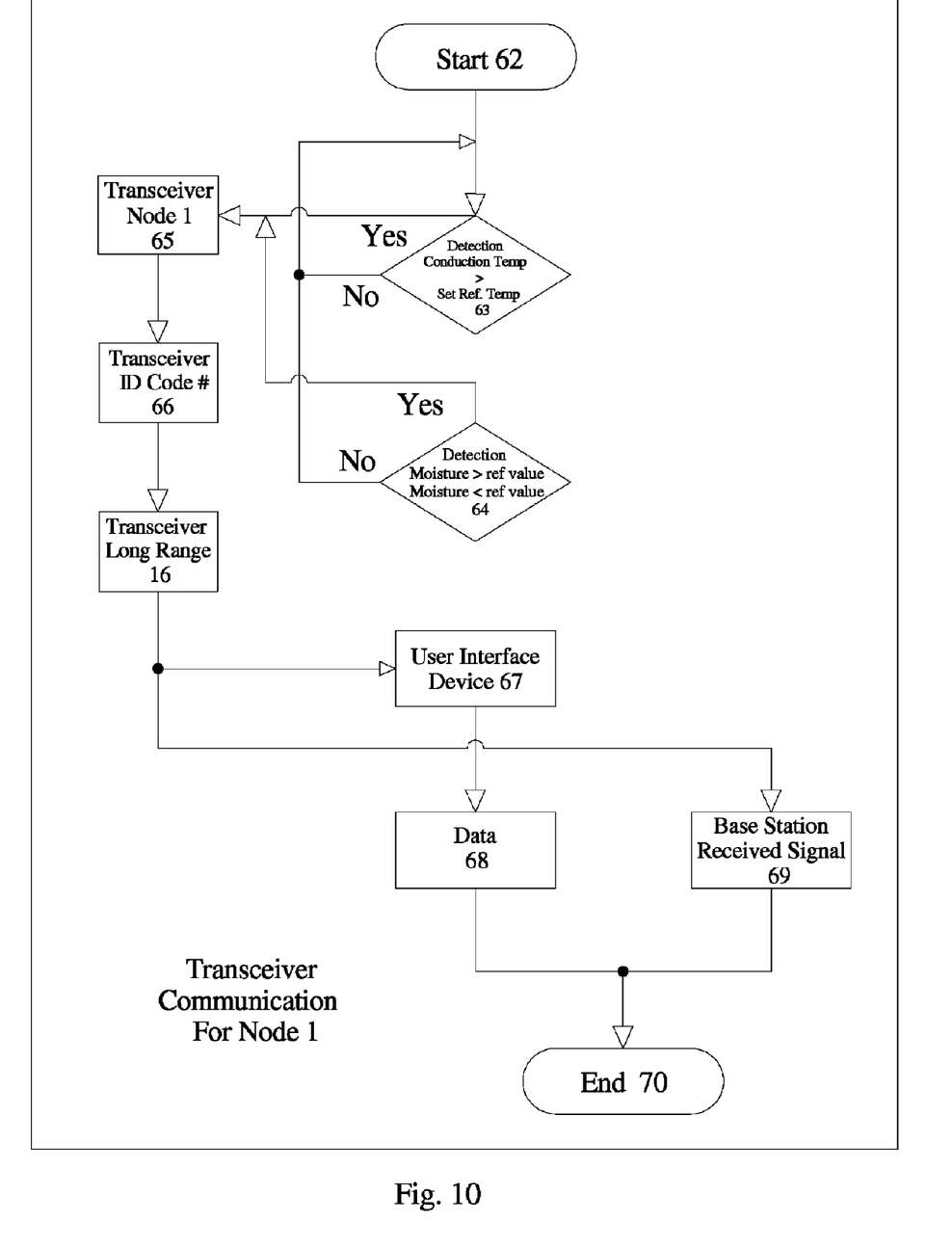
FIG. 10 is a flowchart diagram illustrating the sensor transfer data communication.

Lastly, FIG. 10 shows a flowchart diagram of the general transfer of sensor data (conduction temperature and camera input 63, and ground moisture content 64) to the base station 69. If a signal is generated, said signal is sent to a short range transceiver node 14, which is passed on to a second mid range transceiver 15 with an identification code (ID) to identify which power line pole has a fault. This signal is then passed on to a long range transceiver 16 at which point the signal or data 66 may be accessed by a user on the ground via a PC user interface 65 or passed on to a base station 67 or utility. Once the signal has been acquired by the base station 67 the procedure ends 68 and resets to the start 62 position. In the method shown, certain elements may be performed simultaneously or in a different order than that shown.

The various embodiments of the present invention as shown in FIGS. 1-10 may be arranged and designed in a wide variety of different configurations that fall within the scope of the present invention, and may be applied to any type of system involving the sensing and measuring of conditions at or surrounding a high voltage power line.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

The invention claimed is:

1. A system for monitoring and transmitting line conditions of high voltage power lines comprising:
   a ground moisture sensor coupled to a first transceiver;
   a non-contact temperature sensor coupled to a second transceiver;
   a camera sensor for visual monitoring of an area around a base of said high voltage power line coupled to said second transceiver;
   a user interface device coupled to and in communication with both said first and second transceivers;
   a non-inductance power source connected to the ground moisture sensor, the non-contact temperature sensor, the first transceiver and the second transceiver; and
   a plurality of data transceivers for receiving and transmitting generated data to and from a base station via a hybrid topology network;
   wherein said plurality of data transceivers, includes short range, mid range, and long range transceivers; and
   wherein all of said sensors and transceivers operate together to sense a visual, temperature, and moisture characteristics of said high voltage power lines and a surrounding area of said high voltage power lines.

2. The system of claim 1, wherein said ground moisture sensor comprises a means for detecting the change in ground electrical conductance via the absorption of a generated infrared light signal due to atmospheric and soil moisture content.

3. The system of claim 1, wherein said non contact temperature sensor comprises a means for detecting infrared radiation from an emitting body.

4. The system of claim 1, wherein said camera sensor comprises an electronic digital element capable of transforming a given set of visual and infrared light frequencies into a digital signal to be analyzed.

5. The system of claim 1, wherein said camera sensor comprises a CCD sensor element.

6. The system of claim 1, wherein said camera sensor comprises a CMOS sensor element.

7. The system of claim 1, wherein said user interface device comprises a means for directly accessing said data transceivers via interface processing circuitry at their respective locations.

8. The system of claim 7, wherein said user interface device is an LCD display.

9. The system of claim 7, wherein said user interface device is a USB interface.

10. The system of claim 7, wherein said user interface device is accessible at each node by a portable wireless mobile device.

11. The system of claim 1, wherein said power source is a solar cell coupled to rechargeable battery.

12. The system of claim 1, wherein said plurality of data transceivers for receiving and transmitting said measured characteristics from said sensors and said interface processing circuitry for retrieving operational status information from said user interface device about the measured condition of said power lines operates on radio-frequencies.

13. The system of claim 1, wherein said plurality of transceivers for receiving and transmitting said measured characteristics from said sensors and said interface processing circuitry for retrieving operational status information from said user interface device about the measured condition of said power lines comprises:
   a short-range transceiver for communication with said sensors, mid-range transceivers, and long-range transceivers;
   a mid-range transceiver for communicating with said short-range and said long-range transceivers; and
   a long-range transceiver for communicating with said short-range, mid-range, and other long-range transceivers;
   wherein said short, mid, and long-range transceivers operate via wireless radio-frequencies.

14. The system of claim 1, wherein said short-range, mid-range, and long-range transceivers operate via a directly connected local area network.

15. The system of claim 1, wherein said sensors and transceivers are located on a separate sensor pole from the high voltage power line pole.

16. The system of claim 1 wherein said short-range transceivers generate an internal reference transceiver identification code for each respective sensor to be correlated with the pre-existing utility assigned identification code associated with each respective power line for determining the source and nature of said transmitted sensor conditions.

17. A system for monitoring and transmitting line conditions of high voltage power lines comprising:
   a ground moisture sensor coupled to a first transceiver;
   a non-contact infrared temperature sensor coupled to a second transceiver;
   a camera sensor for visual monitoring of an area around a base of said high voltage power line coupled to said second transceiver;
   a user interface device coupled to and in communication with both said first and second transceivers;
   a non-inductance solar power source connected to the ground moisture sensor, the non-contact infrared temperature sensor, the first transceiver and the second transceiver; and
   a plurality of data transceivers for receiving and transmitting generated data to and from a base station via a hybrid topology network;
   wherein said plurality of data transceivers, includes short range, mid range, and long range transceivers;
   wherein said user interface device is accessible at each node by a portable wireless mobile device; and
   wherein said ground moisture sensor comprises a means for detecting a change in ground electrical conductance via an absorption of a generated infrared light signal due to atmospheric and soil moisture content.

* * * * *